United States Patent [19]

Dorda et al.

[11] 4,219,829

[45] Aug. 26, 1980

[54] FIELD EFFECT TRANSISTOR HAVING A SURFACE CHANNEL AND ITS METHOD OF OPERATION

[75] Inventors: Gerhard Dorda, Munich; Ignaz Eisele, Ottobrunn, both of Fed. Rep. of Germany

[73] Assignee: Siemens Aktiengesellschaft, Berlin & Munich, Fed. Rep. of Germany

[21] Appl. No.: 793,714

[22] Filed: May 4, 1977

[30] Foreign Application Priority Data

May 4, 1976 [DE] Fed. Rep. of Germany ....... 2619663

[51] Int. Cl.² .......................................... H01L 29/72
[52] U.S. Cl. ........................................ 357/23; 357/22; 357/57; 357/91
[58] Field of Search .................... 357/23, 22, 91, 57

[56] References Cited

U.S. PATENT DOCUMENTS

| | | | |
|---|---|---|---|
| 4,053,915 | 10/1977 | Cave | 357/91 |
| 4,078,947 | 3/1978 | Johnson et al. | 357/91 |
| 4,145,233 | 3/1979 | Sefick et al. | 357/91 |

Primary Examiner—Edward J. Wojciechowicz
Attorney, Agent, or Firm—Hill, Van Santen, Steadman, Chiara & Simpson

[57] ABSTRACT

A field effect transistor includes a semiconductor substrate of a first conductivity having a source zone and a drain zone of an opposite, second conductivity spaced apart therein and extending to the surface thereof. A surface channel adjoins the surface, is of the second conductivity, and extends in an area located between the source and drain zones. A gate electrode is carried above the surface channel, either on an insulator, or directly on the surface to form a Schottky junction. A second zone lies beneath the surface below or in overlapping relation to the surface channel and extends between the drain and source zones. The second channel is doped with dopant particles whose energy level in the forbidden band of the semiconductor substrate, at an operating temperature T, lies at a distance of more than ½ kT from the conduction band edge and valence band edge of the semiconductor substrate. Application of proper potentials with respect to the start voltage required for ionization of the dopant particles in the second channel causes the field effect transistor to function as a high-speed switch. Connection of the field effect transistor in series with a resistance between the poles of a power supply which has a voltage greater than the start voltage causes the field effect transistor to operate, in combination with the resistor, as an oscillator.

17 Claims, 4 Drawing Figures

FIELD EFFECT TRANSISTOR HAVING A SURFACE CHANNEL AND ITS METHOD OF OPERATION

BACKGROUND OF THE INVENTION

1. Field of the Invention

The present invention relates to a field effect transistor in which a semiconductor substrate of a first conductivity has a source zone and a drain zone of the opposite conductivity spaced apart therein and a surface channel in an area between the source and drain zones which adjoins the surface of the semiconductor substrate and which has the second type of conductivity, and a gate electrode arranged over the surface channel.

2. Description of the Prior Art

In solid state electronics, various components are known which have a current-voltage characteristic which include regions of negative, differential resistance. Components of this type are, for example, tunnel-diodes, Gunn elements and IMPATT diodes. Another component having a negative, differential resistance is the Cryosar in which an avalanche breakdown is employed, which is triggered at low temperatures in the semiconductor by impact ionization of dopant particles, as reported in the Proceedings of the IRE, 1959, pp. 1207-1213. Components of this type are used primarily as high-speed switches, as their switching time is less than $10^{-8}$ seconds, and also as generators of electronic oscillations in the GHz range. These components are two-terminal networks whose operating point, and thus also the frequency of the oscillations which they produce, is dependent upon their construction and upon the operating voltage connected thereto.

If, for example, the oscillating frequency in an oscillating circuit equipped with a Gunn element is to be changed, the operating voltage directly connected to the Gunn element must be modified. A further disadvantage of the known components of this type resides in the fact that they cannot be produced by the processes employed for the production of MIS components, and for this reason they are not suitable for construction in integrated circuits. It is desirable to achieve components having a negative differential resistance whose operating point is controlled not only by varying the operating voltage, but also by a further auxiliary voltage. In this case, the control by the auxiliary voltage is to be able to take place using as little power as possible. Furthermore, the component is to be able to be constructed together with other MIS components.

SUMMARY OF THE INVENTION

The primary object of the invention is to provide a component of the type mentioned above, that is a component having a negative differential resistance which is controlled by an operating voltage, and also by an auxiliary voltage, with as little power as possible and capable of integrated construction with other circuit components.

This object is achieved, according to the present invention, in a field effect transistor having a semiconductor substrate of a first conductivity type, in which a source zone and a drain zone of a second conductivity type are provided, along with an interlying surface channel which adjoins the surface of the semiconductor substrate and which is of the second conductivity type, and wherein a gate electrode is arranged above the surface channel. More specifically, between the source zone and the drain there is a second channel which lies to overlap in, or lies beneath, the surface channel and which is doped with dopant particles whose energy level in the forbidden band of the semiconductor substrate, at an operating temperature T, lies at a distance of more than ($\frac{1}{2}$) kT from the edge of the conductivity band and valency band edge of the semiconductor substrate.

According to a particular feature of the invention, the maximum of the concentration of the dopant particles in the second channel lies at a distance of up to 1 $\mu$m beneath the surface of the semiconductor substrate.

According to another feature of the invention, the gate electrode is arranged on an insulating layer applied to the semiconductor substrate.

According to another feature of the invention, the gate electrode is not carried on an insulating layer, but is a Schottky electrode carried directly on the surface of the substrate.

According to particular features of the invention, the semiconductor substrate can consist of silicon, a III-V compound like GaAs. According to other features of the invention, the second channel may be doped with sulphur, zinc, arsenic or indium.

A field effect transistor constructed in accordance with the present invention is capable of being constructed as a part of an integrated circuit on a common substrate with other components.

According to a particular feature of the invention, particularly in connection with the use of arsenic or indium as the second channel dopant material, the field effect transistor is cooled during operation.

With the application of proper potentials to the source, drain and gate electrodes, the field effect transistor of the present invention may be operated as a high-speed switch.

Still another feature of the invention is the utilization of the field effect transistor, in combination with a resistor, as an oscillator circuit for generating, for example, sawtooth oscillations.

The structure of an insulating layer-field effect transistor and also the structure of a field effect transistor having a Schottky gate electrode, both of which possess a surface channel (channel zone adjacent to the substrate surface) have been taken into consideration for the field effect transistor of the present invention. The field effect transistor of the invention differs from conventional field effect transistors of this type in that, in addition to the surface channel, a further, second channel contains dopant particles which bring about a conductivity in the semiconductor substrate at temperatures which exceed the operating temperature.

The basic principle of the field effect transistor of the present invention resides in the fact that, as a result of this type of spatially defined incorporation of dopant particles in another, second channel, when a sufficiently high voltage is connected between the source electrode and the drain electrode, an electrical breakdown can occur between the source electrode and the drain electrode, and that such a breakdown in the current-voltage characteristic of the component leads to a region having a negative, differential resistance. If the gate electrode is connected to a voltage, the field in the semiconductor which has been produced by the gate electrode, also produces a change in the potential conditions in the second channel zone and thus the breakdown characteristic. Therefore, in a field effect transistor constructed in accordance with the present invention, the negative differential resistance can also be varied by means of the voltage connected to the gate control electrode. The dopant particles which are additionally incorporated in relation to a conventional field effect transistor can be introduced into the semiconductor body by ion implantation or by diffusion. This additional doping is carried out such that the maximum in the concentration curve of these dopant particles lies in a region of up to 1 μm beneath the surface of the semiconductor. The further, second channel can be located in the zone of the surface channel, can overlap the surface channel or can lie beneath the surface channel. The concentration maximum of the dopant particles of the second channel is preferably at least 5 nm from the surface of the substrate.

Irrespectively of the conductivity type of the substrate, both donor and acceptor material is used for the second channel. The dopant particles for the additional channel zone preferably are formed from dopants which are difficult to thermally ionize in the semiconductor material of the field effect transistor. Thus, for example, in the case of p-conducting silicon, the further channel zone is doped with sulphur or with zinc, since the energy level of the sulphur doping lies at a distance of 0.18 eV from the conduction band edge, and the energy level of the zinc lies at a distance of 0.31 eV from the valence band edge. Therefore, the thermal ionization of the doping in the second channel, at room temperature (T=300° K.), for sulphur as a doping material is in a proportion of $$e^{(-0.18/kT)} = 0.1\%$$

where k signifies the Boltzmann constant, and in the case of zinc doping material in a proportion of $$e^{(-0.31/kT)} = 0.001\%$$

and is therefore very weak.

The thermal ionization of other dopant particles whose energy levels lie closer to the valence band edge and to the conduction band edge can be suppressed in that, according to a preferred operating process for the field effect transistor of the present invention, the entire component is cooled. It has, in fact, been proved that at temperatures below 77° K., arsenic or indium which has been introduced into silicon by ion implantation or by diffusion is no longer ionized, and therefore, at low source-drain voltages, in no way contributes to the conductivity between the source zone and the drain zone of the field effect transistor. Therefore, in a field effect transistor constructed in accordance with the present invention, the second channel can also be doped with thermally ionizable dopants which, in respect of energy, lie in the vicinity of the band edge, if, through the selection of the operating temperature, it is ensured that no thermal ionization of the additionally introduced dopant occurs in the operation of the second channel.

BRIEF DESCRIPTION OF THE DRAWINGS

Other objects, features and advantages of the invention, its organization, construction and modes of operation will be best understood from the following detailed description taken in conjunction with the accompanying drawings, on which.

DESCRIPTION OF THE PREFERRED EMBODIMENTS

Figure 1:
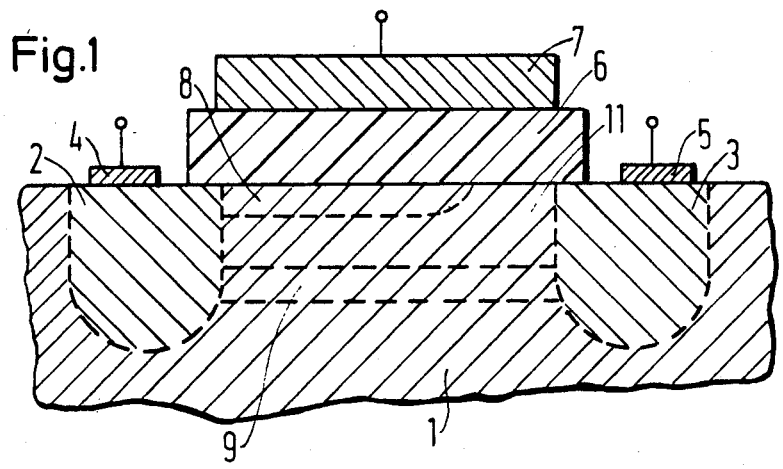
FIG. 1 is a schematic representation, in cross section, of a field effect transistor constructed in accordance with the invention.

FIG. 1 illustrates a field effect transistor constructed in accordance with the present invention. The transistor comprises a semiconductor substrate 1, for example composed of p-conducting silicon, in which two n+ doped zones are arranged as a source zone 2 and a drain zone 3. The n+-doped zones 2 and 3 are provided with respective electrode contacts 4 and 5 which constitute source and drain electrodes. An insulating layer 6 is arranged on the surface of the semiconductor substrate 1, and a metal layer 7 is arranged on the insulating layer 6 as a gate electrode. Beneath the insulating layer 6, between the source zone 2 and the drain zone 3 is a surface channel 8, in which the conductivity type is opposite to that of the substrate. Beneath the surface channel 8 lies a further channel 9 which, in the case of a substrate composed of p-silicon, is doped with doping elements such as, for example, sulphur or zinc.

Figure 2:
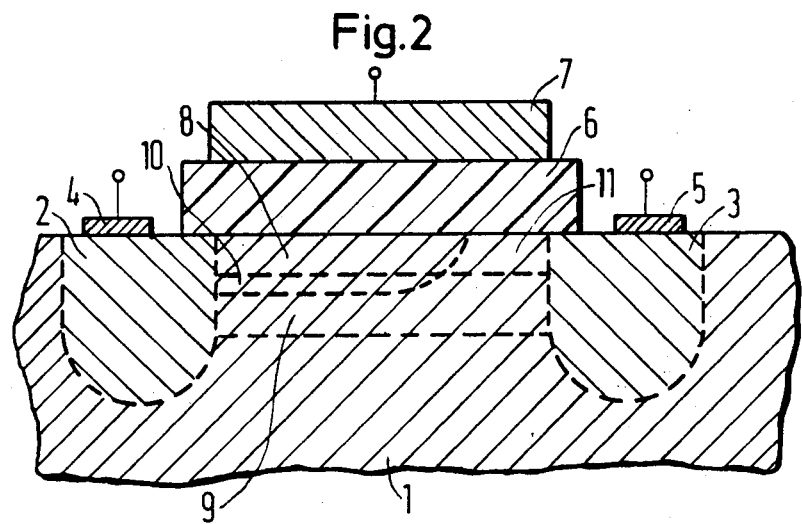
FIG. 2 is a schematic representation, in cross section, of a field effect transistor constructed in accordance with the invention.

The field effect transistor illustrated in FIG. 2 has a similar construction as the transistor of FIG. 1, with the difference that the surface inversion channel 8 and the second channel 9 which has been formed with the dopant particles, lie sufficiently close to one another so as to produce an overlap zone 10 of these two channels. The second channel 9 is produced by an ion implantation process, in which sulphur ions are injected from an ion source in a dose of approximately $5 \times 10^{11}$ to approximately $10^{-}cm^{-2}$ into the semiconductor substrate with an energy of up to 500 keV.

In order to achieve the operating range having a negative, differential resistance during the operation of the field effect transistor of the present invention, the source electrode 4 is connected to zero potential, and the gate electrode is connected to a voltage which is lower than the "start voltage" required for the ionization of the dopant particles located in the second channel 9. The drain electrode 5 is connected to a voltage which is greater than the gate voltage. With this type of operating mode, the field effect transistor lies in the "pinch-off" region in which the surface channel 8, located beneath the semiconductor surface, terminates between the source zone 2 and the drain zone 3, and a "pinch-off" zone 11 remains between the surface channel 8 and the drain zone 3, so that the source zone and the drain zone are not conductively connected to one another. If the drain voltage is now raised to a value which exceeds the "start voltage" for the ionization of the dopant particles contained in the second channel 9, in this additionally doped zone there forms a narrow zone whose conductivity rises irregularly by a few orders of magnitude within approximately $10^{-9}$ seconds, which produces the region having a negative differential resistance in the current-voltage characteristic of the field effect transistor of the present invention. The "start voltage" at which this conductive zone is formed in dependent upon the ionization energy of the dopant, and upon the length of the "pinch-off" zone 11, and also upon the distance of the source and drain zones. In a component in which the channel length amounts to approximately 40 μm, the "start voltage" has a value of, for example, 38 V. When this voltage is exceeded, the current flowing between the source zone and the drain zone rises irregularly by two orders of magnitude in the range between 28 V and 38 V.

Figure 3:
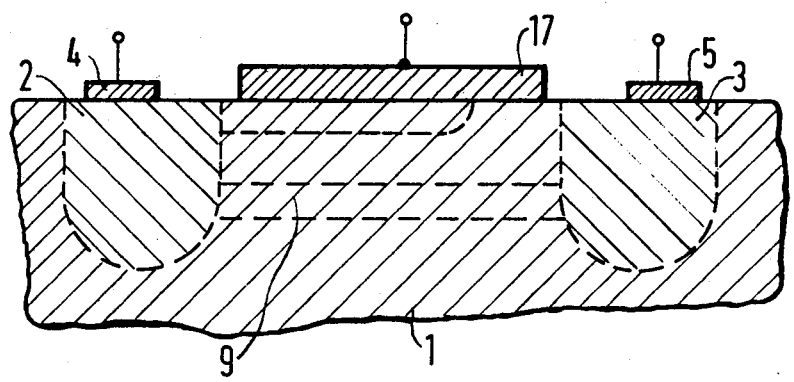
FIG. 3 is a schematic representation, in cross section, of a field effect transistor constructed in accordance with the invention and having a Schottky gate electrode.

Referring now to FIG. 3, a field effect transistor is illustrated which has an identical construction as the field effect transistor of FIG. 1, with the exception that an insulating layer 6 is not provided and a metal layer 17 is carried directly on the surface of the substrate as a Schottky gate electrode.

Figure 4:
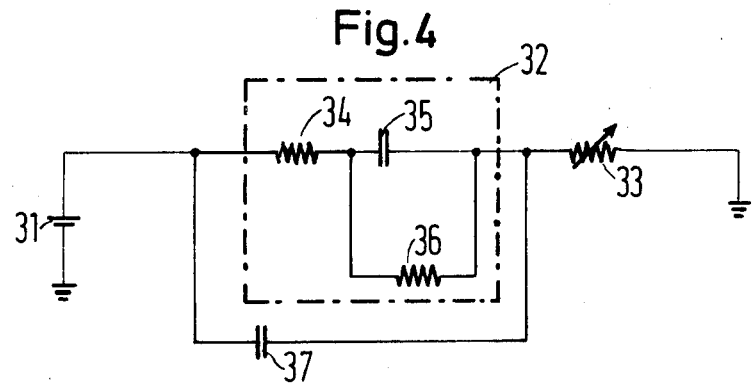
FIG. 4 is a schematic circuit diagram of an oscillator constructed with a field effect transistor, according to the present invention, wherein the field effect transistor has been replaced by its equivalent circuit diagram.

FIG. 4 is a circuit diagram of an arrangement with which a field effect transistor constructed in accordance with the present invention can be used, for example, to produce electrical oscillations. This circuit arrangement comprises a voltage source 31, between the poles of which there is provided a series arrangement composed of a field effect transistor 32 corresponding to that of the present invention and a variable resistor 33. Here in FIG. 4, the field effect transistor has been represented by its equivalent circuit diagram contained in the broken-line frame 32. The resistor $R_c$ of the component has been referenced 34, the capacitance $C_c$ of the component has been referenced 35, and the resistance $R_c^*$ of the channel 9 prior to breakdown is referenced 36. The cable capacitance $C_k$ of the supply lines is referenced 37.

By connecting a constant voltage $V_D$ which is greater than the "start voltage" for the ionization of the dopant particles present in the second channel, it is possible to produce sawtooth oscillations with this arrangement. The frequency of these oscillations is dependent upon the relaxation time $\tau$, which is limited by the recombination time of the dopant particles, and can also be dependent upon the parameters $C_c$, $C_k$, $R_c$ and $R_v$, where $R_v$ is the value of the variable resistor 33. By means of the impact ionization (avalanche multiplication) process, the capacitance $C_c$ of the capacitor 35 is short-circuited, and thus the resistance $R_c^*$ of the resistor 36 is shunted. In the circuit formed by the arrangement, the greatest voltage consequently drops across the resistor 33. In this manner, the voltage dropping across the field effect transistor, between the source and the drain is reduced, and the "start voltage" is undershot. In order that a new breakdown can take place, it is necessary to recharge the capacitance of the component $C_c$ (capacitor 35), and here the charging time is determined by the relaxation time $\tau$. The relaxation time can be influenced both by the value of the resistance 33 and also by the gate voltage which is connected to the field effect transistor of the present invention.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A field effect transistor, comprising:
   a semiconductor substrate of a first conductivity type;
   a source zone and a drain zone each of a second conductivity type spaced apart in said substrate;
   a surface channel of the second conductivity type adjoining the surface of said substrate in an area between said source and drain zones;
   a gate electrode carried over said surface channel;
   a surface depletion zone; and
   a second channel in said surface depletion zone below said surface channel and extending between and connecting said source and drain zones below the surface of said substrate, said second channel including dopant particles having an energy level in the forbidden band of the semiconductor substrate which, at an operating temperature T, lies at a distance of more than ½ kT from the conduction band edge and valance band edge of said semiconductor substrate, where k is the Boltzmann constant, and whereat, by an electric field induced ionization, an additional conductivity occurs which causes a negative differential resistance.

2. The field effect transistor of claim 1, wherein said second channel overlaps said surface channel.

3. The field effect transistor of claim 1, wherein: in said second channel, the maximum of the concentration of the dopant particles lies at a distance of up to 1 μm beneath the surface of said substrate.

4. The field effect transistor of claim 1, comprising: an insulating layer carried on said surface of said substrate, said gate electrode carried on said insulating layer.

5. The field effect transistor of claim 1, wherein: said gate electrode is carried directly on said surface and forms a Schottky contact therewith.

6. The field effect transistor of claim 1, wherein said semiconductor substrate comprises silicon.

7. The field effect transistor of claim 1, wherein said semiconductor substrate comprises a III-V compound.

8. The field effect transistor of claim 1, wherein said semiconductor substrate comprises GaAs.

9. The field effect transistor of claim 1, wherein said second channel is a sulphur-doped channel.

10. The field effect transistor of claim 1, wherein said second channel is zinc-doped.

11. The field effect transistor of claim 1, wherein said second channel is arsenic-doped.

12. The field effect transistor of claim 1, wherein said second channel is indium-doped.

13. A method of providing a high-speed field effect transistor switch, beginning with a transistor including a semiconductor substrate of a first conductivity type, a source zone and a drain zone each of a second conductivity type spaced apart in the substrate, the source and drain zones carrying respective source and drain electrodes, a surface channel of the second conductivity type adjoining the surface of the substrate in an area between the source and drain zones, and a gate electrode carried over the surface channel, comprising the steps of:
   forming a second channel below said surface channel between and connecting the source and drain zones, with dopant particles having an energy level in the forbidden band of the semiconductor substrate which, at an operating temperature T, lies at a distance of more than ½ kT from the conduction band edge and the valance band edge of the semiconductor substrate, where k is the Boltzmann constant;
   applying zero potential to the source electrodes;

applying a voltage to the gate electrode which is lower than the start voltage required for ionization of the dopant particles in the second channel;
applying a voltage to the drain electrode which is lower than the start voltage and greater than the voltage applied to the gate electrode; and
raising the voltage applied to the drain electrode to a value which exceeds the start voltage.

14. The method of claim 13, comprising the step of cooling the transistor during operation.

15. A method of providing a field effect transistor oscillator beginning with a field effect transistor which comprises a semiconductor substrate of a first conductivity type, a source zone and a drain zone each of a second conductivity type spaced apart in the substrate, the source and drain zones carrying respective electrodes, a surface channel of the second conductivity type adjoining the surface of the substrate in an area between the source and drain zones, and a gate electrode carried over the surface channel, comprising the steps of:
forming a second channel below said surface channel between and connecting the source and drain zones, with dopant particles having an energy level in the forbidden band of the semiconductor substrate which, at an operating temperature T, lies at a distance of more than $\frac{1}{2}$ kT from the conduction band edge and the valance band edge of the semiconductor substrate, where k is the Boltzmann constant; and
connecting the source and drain electrodes of the transistor in series with a resistor between the poles of a voltage source having a potential which is greater than the start voltage required for ionization of the dopant particles in the second channel.

16. The method of claim 15, wherein the step of connecting is further defined as connecting a variable resistor in series with the transistor, and varying the resistance value of the variable resistor to adjust the relaxation time of the oscillatory operation.

17. The method of claim 15, comprising the further steps of:
deriving a control voltage; and
applying the control voltage to the gate electrode to control the relaxation time of the oscillatory operation.

* * * * *